(12) United States Patent
Otsuka

(10) Patent No.: US 10,686,082 B2
(45) Date of Patent: Jun. 16, 2020

(54) PHOTOVOLTAIC GENERATION SYSTEM AND METHOD FOR USING THE SAME

(71) Applicant: SHIN-ETSU CHEMICAL CO., LTD., Tokyo (JP)

(72) Inventor: Hiroyuki Otsuka, Karuizawa-machi (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 121 days.

(21) Appl. No.: 15/759,715

(22) PCT Filed: Aug. 18, 2016

(86) PCT No.: PCT/JP2016/003758
§ 371 (c)(1),
(2) Date: Mar. 13, 2018

(87) PCT Pub. No.: WO2017/047004
PCT Pub. Date: Mar. 23, 2017

(65) Prior Publication Data
US 2019/0051766 A1 Feb. 14, 2019

(30) Foreign Application Priority Data
Sep. 18, 2015 (JP) .................................. 2015-185816

(51) Int. Cl.
*H01L 31/02* (2006.01)
*H02S 40/30* (2014.01)
(Continued)

(52) U.S. Cl.
CPC .......... *H01L 31/02021* (2013.01); *G05F 1/46* (2013.01); *G05F 1/67* (2013.01);
(Continued)

(58) Field of Classification Search
CPC ................. H01L 31/0445; H01L 31/06; H01L 31/02021; H02S 40/30; H02S 30/10; G05F 1/67; G05F 1/46
See application file for complete search history.

(56) References Cited

U.S. PATENT DOCUMENTS

| | | | |
|---|---|---|---|
| 6,528,977 B2* | 3/2003 | Arakawa | G05F 1/67 323/282 |
| 2006/0164049 A1* | 7/2006 | Duerbaum | G05F 1/46 323/271 |

(Continued)

FOREIGN PATENT DOCUMENTS

| | | |
|---|---|---|
| CN | 104345276 A | 2/2015 |
| JP | 2006-324504 A | 11/2006 |

(Continued)

OTHER PUBLICATIONS

May 30, 2019 Office Action and Search Report issued in Chinese Patent Application No. 201680053921.1.
(Continued)

*Primary Examiner* — Golam Mowla
(74) *Attorney, Agent, or Firm* — Oliff PLC

(57) ABSTRACT

A photovoltaic generation system includes: a solar cell array formed with one or more solar cell modules; and a power conditioner, wherein each of the solar cell modules includes one or more solar cells, the photovoltaic generation system further has a first conductive wire connected to a conductor parts which is provided at each of the solar cell modules and which is insulated from the solar cells, and a constant voltage power supply whose one end is connected to the first conductive wire, and a potential is supplied to the conductor parts by the constant voltage power supply. As a result, the photovoltaic generation system which can suppress degradation of solar cell characteristics due to PID while suppressing increase in manufacturing cost of the solar cell module is provided.

20 Claims, 12 Drawing Sheets

(51) Int. Cl.
  *G05F 1/67* (2006.01)
  *H02S 30/10* (2014.01)
  *H01L 31/0445* (2014.01)
  *G05F 1/46* (2006.01)
  *H01L 31/06* (2012.01)

(52) U.S. Cl.
  CPC .......... *H01L 31/0445* (2014.12); *H01L 31/06* (2013.01); *H02S 30/10* (2014.12); *H02S 40/30* (2014.12)

(56) References Cited

U.S. PATENT DOCUMENTS

| | | | |
|---|---|---|---|
| 2009/0078304 A1 | 3/2009 | Gilmore et al. | |
| 2009/0101191 A1* | 4/2009 | Beck | H01L 31/02021 |
| | | | 136/244 |

FOREIGN PATENT DOCUMENTS

| | | |
|---|---|---|
| JP | 2010-541251 A | 12/2010 |
| JP | 2012-099764 A | 5/2012 |
| JP | 2013-004566 A | 1/2013 |
| JP | 2014-072293 A | 4/2014 |
| JP | 2014-099438 A | 5/2014 |
| TW | 200917503 A | 4/2009 |

OTHER PUBLICATIONS

Aug. 28, 2018 Office Action issued in Japanese Patent Application No. 2015-185816.
Nov. 1, 2016 Search Report issued in International Patent Application No. PCT/JP2016/003758.

* cited by examiner

PHOTOVOLTAIC GENERATION SYSTEM AND METHOD FOR USING THE SAME

TECHNICAL FIELD

The present invention relates to a photovoltaic generation system and a method for using the photovoltaic generation system.

BACKGROUND ART

A typical photovoltaic generation system is configured with a solar cell array in which a plurality of solar cell modules are connected, a junction box, a power conditioner, or the like.

PID (Potential Induced Degradation) which will be described later and which becomes a problem in recent years in the above-described photovoltaic generation system mainly occurs at a crystalline solar cell module.

A crystalline solar cell module is made by sealing solar cells each having single-crystal or polycrystalline silicon substrate interconnected with a tab wire, with a seal material such as EVA (Ethylene Vinyl Acetate), further, sandwiching the sealed solar cell between a white tempered plate glass and a back sheet and laminating the sandwiched solar cell. Because a solar cell module normally requires a certain degree of intensity, an aluminum frame is attached around the solar cell module.

As a typical crystalline silicon solar cell, for example, there are crystalline silicon solar cells as disclosed in Patent Documents 1 and 2. Particularly, in the crystalline silicon solar cell disclosed in Patent Document 2, a p-type single-crystal or p-type polycrystalline silicon substrate is used, a light receiving surface electrode and a non-light receiving surface (back surface) electrode are respectively formed with silver paste and aluminum paste as materials using a screen printing method, a silicon nitride film which is an antireflective film on the light receiving surface is formed using a PECVD method, and, further, a diffusion layer which forms pn junction on the light receiving surface side is formed by thermal diffusion using $POCl_3$ gas (phosphorous source gas).

In this photovoltaic generation system, solar cell modules are connected in series such that a voltage of the solar cell array can increase to a necessary voltage. Further, in order to prevent an electrical shock and a fire accident due to electric leakage from solar cell modules, earth wires are extracted from metal frames which enclose the solar cell modules and connected, and one end of the connected earth wire is connected to a grounding electrode.

CITATION LIST

Patent Literature

Patent Document 1: Japanese Unexamined Patent Publication (Kokai) No. 2014-072293
Patent Document 2: Japanese Unexamined Patent Publication (Kokai) No. 2006-324504

SUMMARY OF INVENTION

Technical Problem

However, if connection as described above is made, while all the metal frames of the solar cell modules become 0 V, in the solar cell array, a large potential difference occurs between a positive electrode end and a negative electrode end at an end of the array because of series connection for increasing the voltage, which becomes 200 V or more in a domestic solar cell and becomes from 600 V to 1000 V in an industrial solar cell. This means that while a potential of the metal frame is 0 V at the solar cell module at an end of the array, a domestic solar cell has a potential difference of ±100 V at lowest, and an industrial solar cell has a potential difference of ±300 V to ±500 V at lowest. If such a potential difference is induced on a surface of the solar cell over a long period of time via glass and a seal material, a problem occurs. Degradation of solar cell modules due to this is referred to as PID, and the PID is now a serious problem.

While it is still unknown why PID occurs, it is considered that PID occurs partly because of at least sodium ions present within glass of the solar cell module. Because sodium ions are cations, if potentials of the glass and metal frame of the solar cell module become higher with respect to the solar cell, the cations move within the glass and, further, within the seal material, and are forced to the vicinity of the surface of the solar cell by Coulomb's force. It is considered that this disorders an electric field of pn junction of the solar cell or corrodes the electrode and deteriorates solar cell characteristics.

As a measure against PID, it is mentioned that movability of the sodium ions is stopped, and PID is suppressed if an ionomer, polyolefin, or the like, whose electric resistivity is low is used as a seal material in place of EVA. Further, it is known that PID is less likely to occur in glass which is subjected to chemical processing and in which potassium is substituted for sodium. It is considered that this is because a radius of a potassium ion is larger than a radius of a sodium ion, and thus movability within glass and a seal material is limited. Further, it is said that PID is less likely to occur if conductivity of a film on a surface of the solar cell such as an antireflective film is increased. It can be construed that this is because even if sodium ions aggregate in the vicinity of the solar cell, the film with high conductivity weakens Coulomb's force which is to be exerted inside the cell.

However, all of the above-described measures only increases manufacturing cost of the solar cell module, which merely inhibits spread of photovoltaic generation. Further, it is said that, in a poor environment such as an environment in which the temperature and humidity are high, PID is likely to occur. Therefore, even if the above-described measures are taken, there is a problem that it is impossible to completely eliminate PID depending on the environment.

The present invention has been made in view of the above-described problems, and it is an object of the present invention to provide a photovoltaic generation system which can suppress degradation of solar cell characteristics due to PID while suppressing increase in manufacturing cost of a solar cell module.

Solution to Problem

To achieve the above-described object, the present invention provides a photovoltaic generation system having a solar cell array formed with one or more solar cell modules, and a power conditioner, wherein each of the solar cell modules includes one or more solar cells, the photovoltaic generation system further comprises a first conductive wire connected to a conductor parts which is provided at each of the solar cell modules and which is insulated from the solar cells, and a constant voltage power supply whose one end is connected to the first conductive wire, and a potential is supplied to the conductor parts by the constant voltage power supply.

According to the photovoltaic generation system as described above which comprises the first conductive wire connected to the conductor parts which is provided at each of the solar cell modules and which is insulated from the solar cells and the constant voltage power supply whose one end is connected to the first conductive wire, and in which a potential is supplied to the conductor parts by the constant voltage power supply, it is possible to attract impurity ions included in glass for seal of the solar cell module from the solar cell side to the conductor parts side. By this means, it is possible to realize the photovoltaic generation system in which manufacturing cost of the solar cell module can be suppressed and degradation of solar cell characteristics due to PID can be suppressed.

At this time, it is preferable that a potential supplied to the conductor parts is a negative potential.

In the case where impurity ions included in the glass for seal of the solar cell module are cations like sodium, by making a potential to be supplied to the conductor parts a negative potential, it is possible to effectively attract the impurity ions included in the glass for seal from the solar cell side to the conductor parts side, so that it is possible to effectively suppress degradation of solar cell characteristics due to PID.

At this time, it is preferable that the solar cell module includes a plurality of solar cells, and the solar cells are connected to one another with a second conductive wire.

According to such a configuration, it is possible to further increase an open circuit voltage of the solar cell module.

At this time, it is preferable that the other end of the constant voltage power supply is connected to a third conductive wire, and the first conductive wire is connected to a grounding electrode via the constant voltage power supply and the third conductive wire.

According to such a configuration, it is possible to supply a stable potential to the conductor parts.

At this time, it is preferable that the solar cell array includes a plurality of solar cells, the other end of the constant voltage power supply is connected to the third conductive wire, and the first conducive wire is connected to a solar cell whose potential is the lowest among the plurality of solar cells included in the solar cell array via the constant voltage power supply and the third conductive wire.

According to such a configuration, it is possible to surely make a potential to be supplied to the conductor parts lower than potentials of the solar cells.

At this time, it is preferable that an ammeter is connected to one of the first conductive wire, the constant voltage power supply and the third conductive wire.

According to such a configuration, in the case where the above-described ammeter detects a current, that is, in the case where a current flows, it is possible to catch a signal indicating the detection and stop application of a voltage from the constant voltage power supply by proper judgement. Because detection of a current indicates electric leakage somewhere in the solar cell module, it is possible to preferentially replace or repair the solar cell module by knowing this signal.

At this time, it is preferable that the conductor parts to which the first conductive wire is connected is a metal frame provided so as to enclose the solar cell module.

In this manner, a metal frame whose potential is normally fixed at an earth potential can be preferably used as a conductor parts to which a potential is to be supplied.

At this time, it is preferable that the conductor parts to which the first conductive wire is connected is a conductive film provided so as to enclose the solar cell module, and the first conductive wire is insulated from the metal frame provided so as to enclose the conductive film via an insulating film.

As a result of the first conductive wire is insulated from the metal frame in this manner, even when a potential is supplied, it is possible to reduce a possibility of occurrence of an electric shock accident, or the like, even upon contact with the metal frame.

Further, the present invention provides a method for using the above-described photovoltaic system, wherein a potential is supplied to the conductor parts by the constant voltage power supply.

According to such a method for using the photovoltaic system, it is possible to attract impurity ions included in the glass for seal of the solar cell module from the solar cell side to the conductor parts side by supplying a potential to the conductor parts by the constant voltage power supply, so that it is possible to suppress manufacturing cost of the solar cell module and suppress degradation of solar cell characteristics due to PID.

At this time, it is preferable that a potential is supplied to the conductor parts by the constant voltage power supply while power is not generated.

By this means, as a result of a potential is not supplied to the conductor parts while power is generated, even in the case where there is electric leakage at the solar cell modules, it is possible to safely earth the leaked current. Meanwhile, as a result of a potential is supplied to the conductor parts while power is not generated, it is possible to attract impurity ions included in the glass for seal of the solar cell module from the solar cell side to the conductor parts side, so that, even if PID occurs during power generation, it is possible to restore solar cell characteristics from the degradation while power is not generated.

At this time, it is preferable that a potential having an absolute value of 30% or more of an open circuit voltage of the solar cell module is supplied to the conductor parts by the constant voltage power supply while power is not generated.

Because a potential of each solar cell while power is not generated is substantially constant and there is little difference, by supplying a potential having an absolute value of 30% or more of the open circuit voltages of the solar cell modules which constitute the solar cell array to the conductor parts, even if PID occurs while power is generated, it is possible to effectively restore solar cell characteristics from the degradation while power is not generated.

Advantageous Effects of Invention

As described above, according to the photovoltaic generation system of the present invention, which comprises a first conductive wire connected to a conductor parts which is provided at a solar cell module and which is insulated from a solar cell, and a constant voltage power supply whose one end is connected to the first conductive wire, by supplying a potential to the conductor parts by the constant voltage power supply, it is possible to attract impurity ions included in glass for seal of the solar cell module from the solar cell side to the conductor parts side. By this means, it is possible to provide a photovoltaic generation system which can suppress degradation of solar cell characteristics due to PID while suppressing increase in manufacturing cost of the solar cell module. Further, according to the method for using the photovoltaic system, by supplying a potential to the conductor parts by the constant voltage power supply, it is possible to attract impurity ions included in the glass for seal of the solar cell module from the solar cell side to the conductor parts side, so that it is possible to suppress manufacturing cost of the solar cell module and suppress degradation of solar cell characteristics due to PID.

DESCRIPTION OF EMBODIMENT

While the present invention will be described below in detail with reference to the drawings as an example of an embodiment, the present invention is not limited to this.

As mentioned above, while, in a photovoltaic generation system, an earth wire is extracted from a metal frame provided at solar cell module and is connected to a grounding electrode, such connection provides an extremely large potential difference within the module (that is, between the solar cell and the metal frame). There is a problem that this potential difference moves impurity ions present within glass of the solar cell module to inside the glass and further inside a seal material by Coulomb's force, so that impurity ions are forced to the vicinity of the surface of the solar cell, which ruins output characteristics of the solar cells and degrades solar cell module characteristics. This is referred to as PID, which is a serious problem now.

To address this, while it is proposed to change a seal material to be used for seal or a material of glass, or improve conductivity of a film on a surface of the solar cell such as an antireflective film, there remain problems in both methods that manufacturing cost increases and that it is impossible to completely eliminate PID in a poor environment.

Therefore, the present inventor has studied hard a photovoltaic generation system which can suppress degradation of solar cell characteristics due to PID while suppressing increase in manufacturing cost. As a result, the present inventor has found that, in a photovoltaic generation system which comprises a first conductive wire connected to a conductor parts which is provided at each of solar cell modules and which is insulated from solar cells and a constant voltage power supply whose one end is connected to the first conductive wire, and in which a potential is supplied to the conductor parts by the constant voltage power supply, it is possible to attract impurity ions included in glass for seal of the solar cell module from the solar cell side to the conductor parts side, and thereby it is possible to suppress degradation of solar cell characteristics due to PID while suppressing increase in manufacturing cost of the solar cell module, thereby bringing the present invention to completion.

The photovoltaic generation system of the present invention will be described first with reference to FIG. 1.

Figure 1:
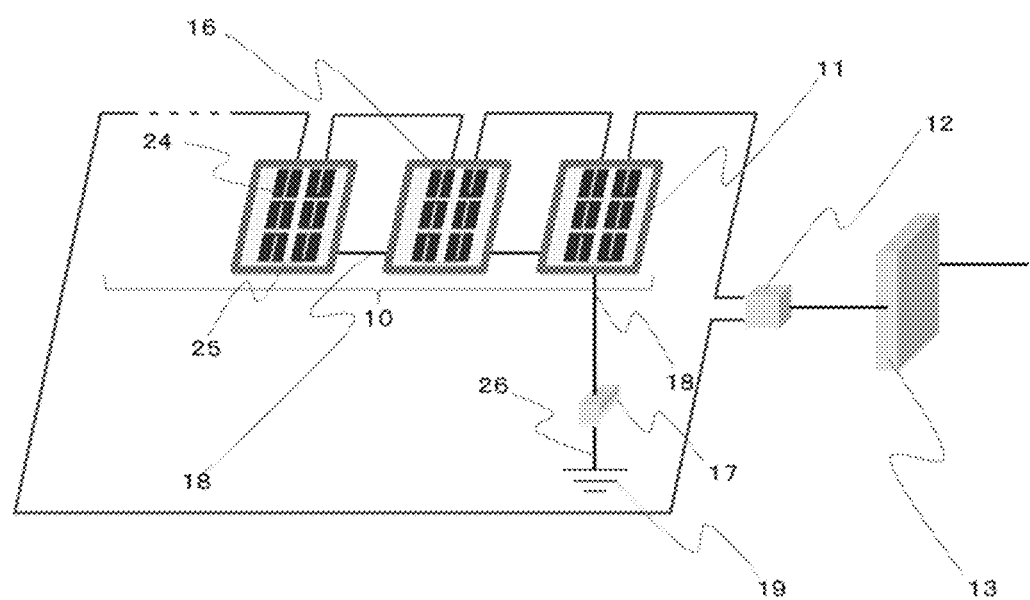
FIG. 1 is a configuration diagram illustrating an example of an embodiment (first aspect) of a photovoltaic generation system of the present invention.

As illustrated in FIG. 1, the photovoltaic generation system of the present invention includes a solar cell array 10 formed with one or more solar cell modules 11 and a power conditioner 13, and each of the solar cell modules 11 includes one or more solar cells 24. The photovoltaic generation system of the present invention further includes a first conductive wire 18 connected to a conductor parts (for example, a metal frame 16) which is provided at each of the solar cell modules 11 and which is insulated from the solar cells 24, and a constant voltage power supply 17 whose one end is connected to the first conductive wire 18, and a potential is supplied to the conductor parts by the constant voltage power supply 17. The solar cell array 10 can be connected to the power conditioner 13 via a junction box 12 and can supply power to outside by way of the power conditioner 13.

Because the photovoltaic generation system of the present invention includes the first conductive wire 18 connected to the conductor parts (for example, the metal frame 16) which is provided at each of the solar cell modules 11 and which is insulated from the solar cells 24 and the constant voltage power supply whose one end is connected to the first conductive wire 18, and a potential is supplied to the conductor parts by the constant voltage power supply in this manner, it is possible to attract impurity ions included in glass for seal of the solar cell module 11 from the solar cell side to the conductor parts side, so that it is possible to realize a photovoltaic generation system which can suppress degradation of solar cell characteristics due to PID while suppressing increase in manufacturing cost of the solar cell module 11.

It is preferable that, in the photovoltaic generation system of the present invention, a potential to be supplied to the conductor parts is a negative potential.

In the case where impurity ions included in the glass for seal of the solar cell module are cations like sodium, by making the potential to be supplied to the conductor parts a negative potential, it is possible to effectively attract impurity ions included in the glass for seal from the solar cell side to the conductor parts side, so that it is possible to effectively suppress degradation of solar cell characteristics due to PID.

In the photovoltaic generation system of the present invention, it is preferable that the solar cell module 11 includes a plurality of solar cells 24, and the solar cells 24 are connected to one another with a second conductive wire 25 (see FIG. 1). According to such a configuration, it is possible to further increase an open circuit voltage of the solar cell module 11 while power is generated.

In the photovoltaic generation system of the present invention, it is preferable that the other end (a side opposite to a side connected to the first conductive wire 18) of the constant voltage power supply 17 is connected to a third conductive wire 26, and the first conductive wire 18 is connected to the grounding electrode 19 via the constant voltage power supply 17 and the third conductive wire 26 (see FIG. 1). According to such a configuration, it is possible to supply a stable potential to the conductor parts (for example, the metal frame 16).

In the photovoltaic generation system of the present invention, it is preferable that an ammeter is connected to one of the first conductive wire 18, the constant voltage power supply 17 and the third conductive wire 26. According to such a configuration, in the case where the above-described ammeter detects a current, that is, in the case where a current flows, it is possible to catch a signal indicating the detection and stop application of a voltage from the constant voltage power supply by proper judgement. Because detection of a current indicates that there is electric leakage somewhere in the solar cell module, it is possible to preferentially replace or repair the solar cell module by knowing this signal.

In the photovoltaic generation system of the present invention, it is possible to use the metal frame 16 provided so as to enclose the solar cell module 11, as the conductor parts to which the first conductive wire 18 is connected (see FIG. 1). It is possible to suitably use a metal frame whose potential is normally fixed at an earth potential as the conductor parts to which a potential is to be supplied in this manner.

Further, as will be described later, in the photovoltaic generation system of the present invention, it is also possible to employ a configuration where the conductor parts to which the first conductive wire 18 is connected is a conductive film (for example, a conductive tape) provided so as to enclose the solar cell module 11, and the first conductive wire 18 is insulated from the metal frame (for example, an aluminum frame) 16 provided so as to enclose the above-described conductive film via an insulating film (for example, an insulating tape). In this manner, by insulating the first conductive wire 18 from the metal frame 16, even when a potential is supplied, it is possible to further reduce a possibility of occurrence of an electric shock accident, or the like, even upon contact with the metal frame.

A method for using the photovoltaic generation system of the present invention will be described next with reference to FIG. 1.

In the method of using the photovoltaic generation system of the present invention, a potential is supplied to the conductor parts (for example, the metal frame 16) by the constant voltage power supply 17 using the photovoltaic generation system described above (see FIG. 1). By supplying a potential to the conductor parts (for example, the metal frame 16) by the constant voltage power supply 17 in this manner, it is possible to attract impurity ions included in glass for seal of the solar cell module from the solar cell side to the conductor parts side, so that it is possible to suppress degradation of solar cell characteristics due to PID while suppressing manufacturing cost.

In the method for using the photovoltaic generation system of the present invention, it is preferable that a potential is supplied to the conductor parts by the constant voltage power supply while power is not generated. A switch is provided on the first conductive wire 18 side of the constant voltage power supply 17, so that the first conductive wire 18 can be connected to the constant voltage power supply 17 or the grounding electrode 19 by switching the switch, and a potential is supplied to the conductor parts (for example, the metal frame 16) by the constant voltage power supply 17 by switching the switch to the constant voltage power supply 17 side while power is not generated, while the conductor parts is connected to ground by switching the switch to the grounding electrode 19 side while power is generated. By this means, while power is generated, even in the case where there is electric leakage at the solar cell module 11, it is possible to safely earth the leaked current. Meanwhile, while power is not generated, by supplying a potential to the conductor parts, it is possible to attract impurity ions included in glass for seal of the solar cell module from the solar cell side to the conductor parts side, so that, even if PID occurs while power is generated, it is possible to restore solar cell characteristics from the degradation while power is not generated.

In the method for using the photovoltaic generation system of the present invention, it is preferable that a potential having an absolute value of equal to or greater than 30% of an open circuit voltage of the solar cell module 11 is supplied to the conductor parts (for example, the metal frame 16) by the constant voltage power supply 17 while power is not generated.

Because a potential of each solar cell is constant, and there is little difference while power is not generated, by supplying a potential having an absolute value of equal to or greater than 30% of the open circuit voltages of the solar cell modules which constitute the solar cell array to the conductor parts, even if PID occurs while power is generated, it is possible to effectively restore solar cell characteristics from the degradation while power is not generated.

An example (first aspect) of an embodiment of the photovoltaic generation system of the present invention will be described in detail below with reference to FIG. 1 to FIG. 3.

Figure 2:
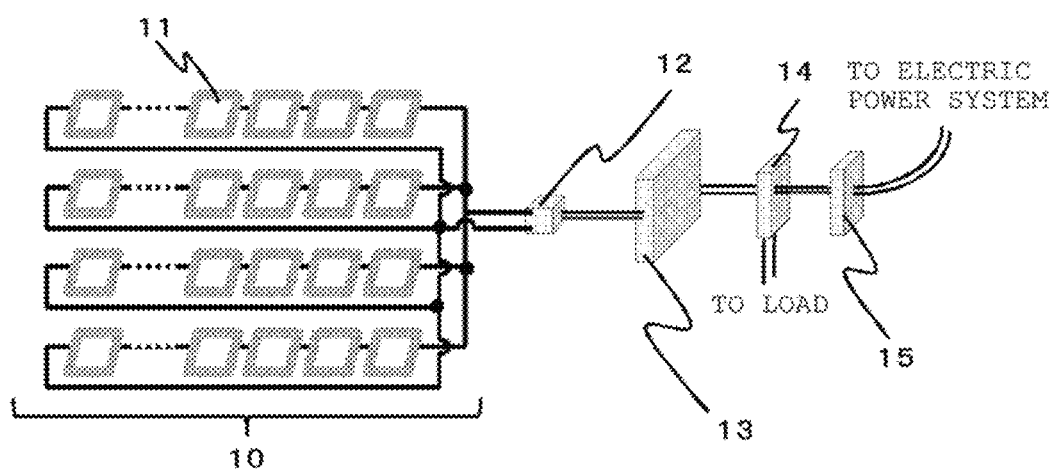
FIG. 2 is a configuration diagram illustrating an example of a general photovoltaic generation system.

First, as illustrated in FIG. 2, the solar cell array 10 is prepared. Specifically, the solar cell modules 11 are prepared and connected with wires. The number of modules within the solar cell array 10 is normally determined from an input voltage range of the power conditioner 13. For example, the maximum number of modules is made an integer close to a value obtained by multiplying a maximum input voltage by a safety factor of 0.8 to 0.9 and dividing the modified maximum input voltage by the open circuit voltage of the solar cell module 11. Because a voltage of the solar cell module 11 increases in cold district, or the like, this should be taken into account as the safety factor. On the other hand, the minimum number of modules is made an integer close to a value obtained by dividing a minimum input voltage by a safety factor of 0.9 and dividing the modified minimum input voltage by an optimum operation voltage of the module. The safety factor should be considered while voltage drop of the solar cell module 11 in hot district is taken into account.

Terminals of one series of the solar cell array in which the solar cell modules 11 are connected in series are collected in plural series, and connected to the power conditioner 13 via the junction box 12. The power conditioner 13 has a function of converting DC power generated at the solar cell array into AC power and automatically managing operation of the whole system, and, further performing linkage protection. The junction box 12 collects DC power generated at the solar cell array 10 and supplies the DC power to the power conditioner, and incorporates a DC side switch to prevent reverse flow of a current. The junction box 12 further has a function of absorbing serge. Rating of the power conditioner 13 is approximately 5 kW in a domestic solar cell, and approximately 10 to 500 kW in an industrial solar cell. Because output of the solar cell array 10 in a domestic solar cell is mostly equal to or less than 5 kW, the solar cell is often configured with only one power conditioner 13. Meanwhile, in a case of a large industrial solar cell, the number of power conditioners 13 is determined while price, grounding conditions, or the like, of the power conditioner 13 are taken into account.

Further, to consume power generated by solar light at home, it is necessary to connect to a load (domestic electric equipment) via a distribution board 14. In the case of reversely flowing power to an electric power system, it is necessary to mount a ground fault overvoltage relay on a receiving board 15, and in the case of not reversely flowing power, it is necessary to mount a reverse power relay and an underpower relay at the receiving board 15 in addition to a ground fault overvoltage relay. In this manner, the distribution board 14 and the receiving board 15 have a function of distributing power supplied from an electric power company and a solar cell array and transmitting the power to domestic electric equipment or transmit power generated at the solar cell to an electric power company.

Further, a display apparatus which displays instantaneous generated power, a cumulative generated power amount, or the like, in real time is often prepared, and utilized to capture data of a thermometer and a pyrheliometer.

In this manner, in construction of a photovoltaic generation system, in the photovoltaic generation system of the present invention, for example, as illustrated in FIG. 1, the constant voltage power supply 17 is connected to the conductor parts (for example, the metal frame 16) of the solar cell module. Specifically, a hole is made at an end of the metal frame 16, a screw is installed into the hole, and is connected to the constant voltage power supply 17 with a conductive wire (first conductive wire) 18. For safety, it is preferable that an insulating tape is provided at the screw so as to prevent an electric shock at the solar cell module. Here, because cost increases if the constant voltage power supply 17 is prepared for each of the solar cell modules, the metal frames 16 of adjacent solar cell modules are connected with the conductive wire (first conductive wire) 18 so that one constant voltage power supply 17 is connected for each array, or for a plurality of arrays. The other terminal of the constant voltage power supply 17 is connected to the grounding electrode 19 buried through class A to D grounding work.

Figure 3:
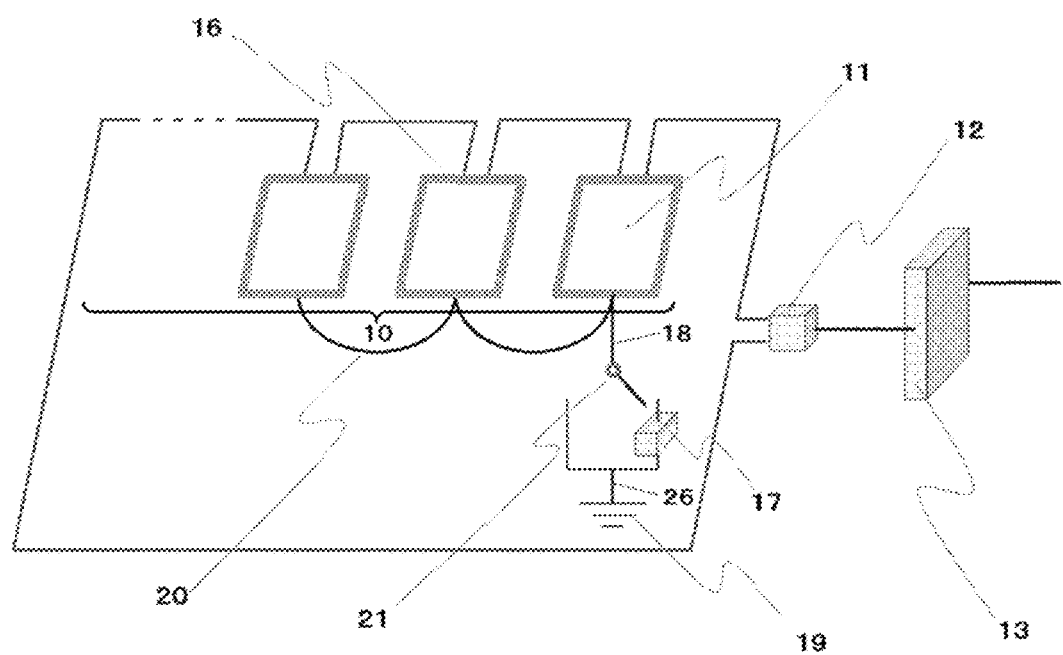
FIG. 3 is a configuration diagram illustrating an example where a switch is provided in the first aspect of the photovoltaic generation system of the present invention.

Further, as illustrated in FIG. 3, it is possible to connect the constant voltage power supply 17 to an end of the earth wire 20 of the solar cell module 11 via the first conductive wire 18 and the switch 21. In such a system, to prevent electric leakage upon supply of a potential when the solar cell module 11 is provided, the conductor parts should be sufficiently insulated from the solar cell within the solar cell module. Further, in the case where the aluminum frame 16 is used as the conductor parts, a high voltage is directly applied to the aluminum frame provided at the solar cell module. Normally, because the aluminum frame of the solar cell module is subjected to alumite treatment, while a surface of the aluminum frame is insulated from the inside, it is necessary to prepare a heavy rail or fence around the solar cell system so as to prevent approach to the solar cell system for safety.

If such a system can be constructed, by supplying a potential to the conductor parts such that a potential of a non-cell portion (that is, the conductor parts) including a chassis of the solar cell module becomes equal to or relatively lower than potentials of the solar cells during a certain period of time, it is possible to make it less likely to attract sodium ions to the solar cell side, and it is possible to keep sodium ions apart from the vicinity of the solar cells. By this means, it is possible to suppress occurrence of PID.

This action will be described in detail below with reference to relationship between potentials of the solar cells within the solar cell modules and a potential of the conductor parts (for example, the metal frame 16) of the solar cell modules in FIG. 4.

Figure 4:
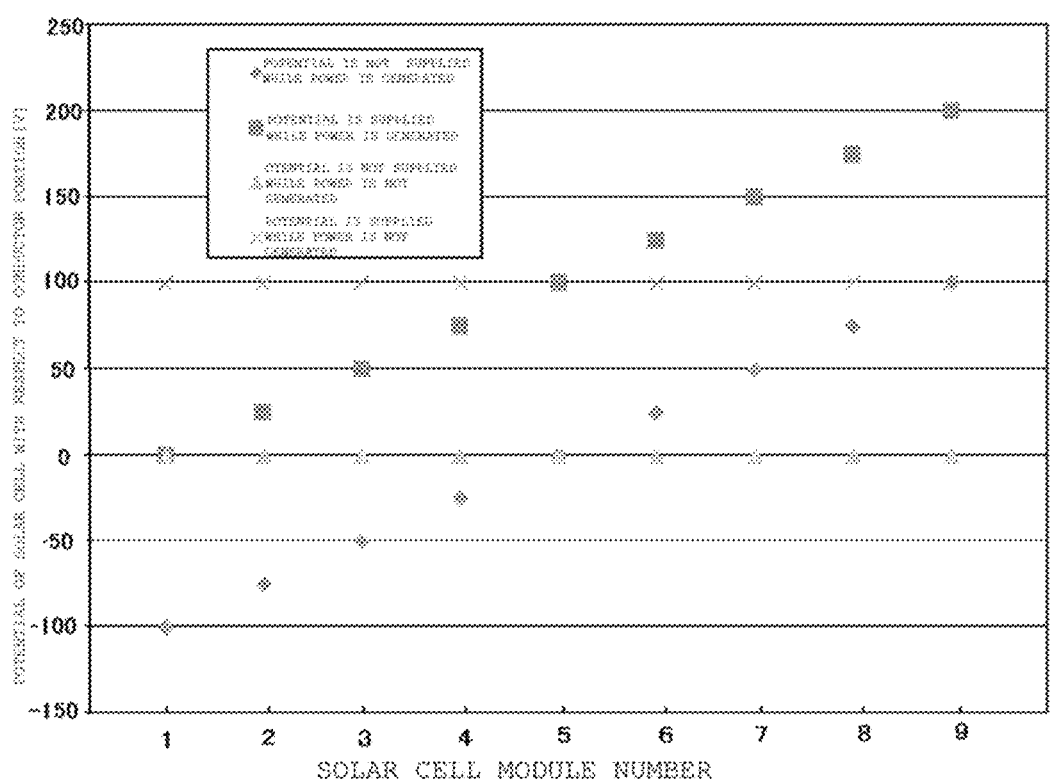
FIG. 4 is a diagram illustrating a potential with respect to a conductor parts of a solar cell representing each solar cell module within a solar cell array of the present invention.

FIG. 4 illustrates a case where nine solar cell modules are connected in series in one system of the solar cell array. It is assumed here that an optimum operating voltage of each of the solar cell modules is 25 V. That is, the solar cell modules generate power under solar light irradiation, and a voltage of the solar cell module increases by 25 V per one solar cell module. Meanwhile, if the conductor parts of the solar cell module is grounded, a potential of the conductor parts becomes 0 V. On the other hand, typically, a potential of the solar cell within each module is from −100 V to 100V (indicated with a black diamond mark in FIG. 4) with respect to the potential (earth potential) of the conductor parts. In this case, potentials of the solar cells of four solar cell modules out of nine solar cell modules become negative potentials with respect to the potential of the conductor parts. Sodium ions included within the glass can move within EVA which is a seal material within the glass, and because the sodium ions are cations, the sodium ions are attracted to the vicinity of the solar cells which have negative potentials with respect to the potential of the metal frame. By this means, an electric field of pn junction of the solar cell is disordered, an electrode erodes or solar cell characteristics degrade.

On the other hand, if, as illustrated in FIG. 1, the first conductive wire 18 connected to the conductor parts is provided, the constant voltage power supply 17 is connected to the first conductive wire 18, and the potential of the conductor parts is intentionally decreased by 100 V, potentials of the solar cells within the solar cell modules 11 become all 0 V or more (indicated with a black square mark in FIG. 4) with respect to the conductor parts. That is, because the potentials of the solar cells 24 become higher than that of the conductor parts, sodium ions which are cations cannot approach the solar cells 24 due to Coulomb's force, that is, PID does not occur.

This also applies while power is not generated. While power is not generated, basically, potentials of the solar cells 24 within the solar cell modules 11 are 0 V (indicated with a black triangle mark in FIG. 4). In this event, if the potential of the conductor parts is intentionally decreased by 100 V, the potentials of the solar cells 24 within the solar cell modules 11 with respect to the conductor parts become all 100 V (indicated with a cross mark in FIG. 4). Also in this event, because the potentials of the solar cells 24 become higher than that of the conductor parts, sodium ions which are cations cannot approach the solar cells 24 due to Coulomb's force, and PID does not occur.

While it is ideal to constantly supply a potential to the conductor parts (for example, the metal frame 16) of the solar cell modules as described above to suppress PID, it is not preferable to supply a potential for 24 hours if electric leakage is taken into account, and it is preferable to supply a potential while power is not generated, such as during nighttime and ground the conductor parts so as to address electric leakage while power is generated. This can be performed by switching the switch 21 illustrated in FIG. 3.

Further, in the case where a potential is supplied to the conductor parts by the constant voltage power supply 17 in order to reduce PID while power is not generated, it is preferable to apply a negative potential of a voltage having an absolute value 30% or more of the open circuit voltages of the solar cell modules which constitute the solar cell array. For example, in a case of the solar cell array configured with solar cell modules having the open circuit voltages of 25 V, if a potential of −7.5 V corresponding to 30% of the open circuit voltages of the solar cell modules is supplied to the conductor parts while power is not generated, because the potential of the conductor parts becomes lower than that of each solar cell of each solar cell module by 7.5 V, as a result, sodium ions, or the like, are attracted from the vicinity of the solar cells to the conductor parts side, so that it is possible to restore the solar cell modules from PID. A voltage of such a degree less often leads to a significant accident even if an electric shock is delivered. Meanwhile, in the case where a negative potential having an absolute value of less than 7.5 V which is less than 30% of the open circuit voltage of the solar cell module is supplied, the solar cell modules cannot be restored from PID in time while power is not generated, an effect of suppressing PID is lower than in the case where a negative potential having an absolute value of 7.5 V or more is supplied.

Subsequently, another example (second aspect) of the embodiment of the solar cell system of the present invention will be described in detail with reference to FIG. 5. Description overlapping with the first aspect will be omitted as appropriate.

First, the solar cell array 10 is prepared. In a similar manner to the above-described first aspect, terminals of one series of the solar cell array in which the solar cell modules 11 are connected in series are collected in plural series, and connected to the power conditioner 13 via the junction box 12, and further connected to a load (domestic electric equipment) via the distribution board 14 (see FIG. 2) so as to enable power generated by solar light to be self-consumed. Still further, the distribution board 14 is connected to the receiving board 15 so as to enable power to reversely flow to the electric power system (see FIG. 2). In addition, it is also possible to prepare a display apparatus, or the like, which displays instantaneous generated power, a cumulative generated power amount, or the like, in real time.

In order to suppress PID, in a similar manner to the above-described first aspect, the conductor parts (for example, the metal frames 16) of the respective solar cell modules 11 of this solar cell array 10 are connected to one another with the earth wire 20 as mentioned above, and an end of the earth wire 20 is connected to the constant voltage power supply 17 via the first conductive wire 18 and the switch 21. The other end of the terminal of the constant voltage power supply 17 is connected to the grounding electrode 19 buried through class A to D grounding work. At this time, for example, the ammeter 22 is inserted such that a current between wire connections of the constant voltage power supply 17 and the solar cell modules, or between the solar cell module 11 and the grounding electrode 19 can be measured. This ammeter may be a clamp meter which does not tear coating of the conductive wire. If the constant voltage power supply 17 has a function of the ammeter, it is also possible to utilize the function.

By constructing such a system, when the ammeter 22 detects a current, that is, when electric leakage of the solar cell module 11 is detected, it is possible to stop supply of a potential to the conductor parts (for example, the metal frame 16), and it is possible to replace the solar cell module 11 with one without a failure at an early point. By inserting the ammeter in this system, it is possible to improve safety as well as suppress loss in photovoltaic generation.

Next, still another example (third aspect) of the embodiment of the photovoltaic generation system of the present invention will be described in detail with reference to FIG. 6. Description overlapping with the first and the second aspect will be omitted as appropriate.

Terminals of one series of the solar cell array 10 in which the solar cell modules 11 are connected in series are collected in plural series, and connected to the power conditioner 13 via the junction box 12, and further connected to the load via the distribution board 14 to enable power generated by solar light to be self-consumed (FIG. 2). Still further, distribution board 14 is connected to the receiving board 15 so as to enable power to reversely flow to the electric power system (see FIG. 2). In addition, it is also possible to prepare a display apparatus, or the like, which displays instantaneous generated power, a cumulative generated power amount, or the like, in real time.

In order to suppress PID, in a similar manner to the above-described first and second aspects, conductor parts (for example, aluminum frame 16) of the respective solar cell modules of this solar cell array are connected to one another with the earth wire 20, and an end of the earth wire 20 is connected to the constant voltage power supply 17 via the first conductive wire 18 and the switch 21. At this time, the other end of the terminal of the constant voltage power supply 17 is directly connected to a cable 27 of a series circuit of the solar cell modules at a junction 23 and connected to a solar cell 24' with the lowest potential in the solar cell array 10 via the cable 27. At this time, by providing the ammeters 22 before and after the constant voltage power supply 17 and setting the switch 21 so as to open the circuit if the ammeters 22 detect electric leakage, safety is further improved.

According to such a circuit configuration, even in the case where a potential is not supplied by the constant voltage power supply 17, potentials of the solar cells within the solar cell modules become equal to or greater than the potentials of the conductor parts of the solar cell modules. By this means, in the case where a voltage is applied, it is possible to surely provide a potential difference between the solar cells and the conductor parts (aluminum frames) regardless of external factors. In this event, it is possible to more surely resolve PID by lowering the potential on the conductor parts side as described above.

As described above in the third aspect, in the photovoltaic generation system of the present invention, because the solar cell array 10 includes a plurality of solar cells 24, the other end of the constant voltage power supply 17 is connected to the third conductive wire 26, and the third conductive wire 26 is connected to the junction 23 instead of being connected to the grounding electrode 19, it is also possible to connect the first conductive wire 18 to the solar cell 24' with the lowest potential among the plurality of solar cells 24 included in the solar cell array 10 via the constant voltage power supply 17 and the third conductive wire 26. According to such a configuration, it is possible to more reliably make the potentials to be supplied to the conductor parts lower than the potentials of the solar cells.

Next, yet another example (fourth aspect) of the embodiment of the solar cell system of the present invention will be described in detail with reference to FIG. 7. Description overlapping with the first to the third aspects will be omitted as appropriate.

In the present aspect, as the conductor parts to which the potential is to be supplied, a conductive film insulated from the metal frame by an insulating film is used instead of the metal frame (for example, the aluminum frame subjected to alumite treatment for insulation) 16. FIG. 7 illustrates a method for attaching the metal frame to the solar cell module 11. In FIG. 7, a conductive tape 72, for example, an aluminum tape is attached to the outer periphery of a laminate molded body 71 formed with glass, a cell, a seal material and a back sheet within the solar cell module 11, and the conductive tape 72 is connected to the constant voltage power supply 17, so that a voltage can be applied to the glass of the solar cell module from outside. The conductive tape 72 can be connected to the constant voltage power supply 17 with a coated conductive wire 75. Further, the conductive tape 72 is insulated by covering the conductive tape 72 with an insulating tape 73, for example, a butyl rubber tape, and a metal frame (for example, an aluminum frame) 76 is attached to the solar cell module 11 by assembling aluminum frame parts 74 around the insulating tape 73. If the conductive tape 72 and the insulating tape 73 have lower moisture permeability, it is possible to further improve reliability of the solar cell module.

As described above, in the solar cell module, by using the conductive film 72 electrically insulated from the metal frame 76 as the conductor parts to which a potential is to be supplied, even if a potential is supplied to the conductor parts by the constant voltage power supply 17, it is possible to lower a possibility that an electric shock accident, or the like, occurs due to contact with the metal frame 76.

EXAMPLES

While the present invention will be more specifically described below using Examples and Comparative Examples, the present invention is not limited to these examples.

Example 1

Figure 5:
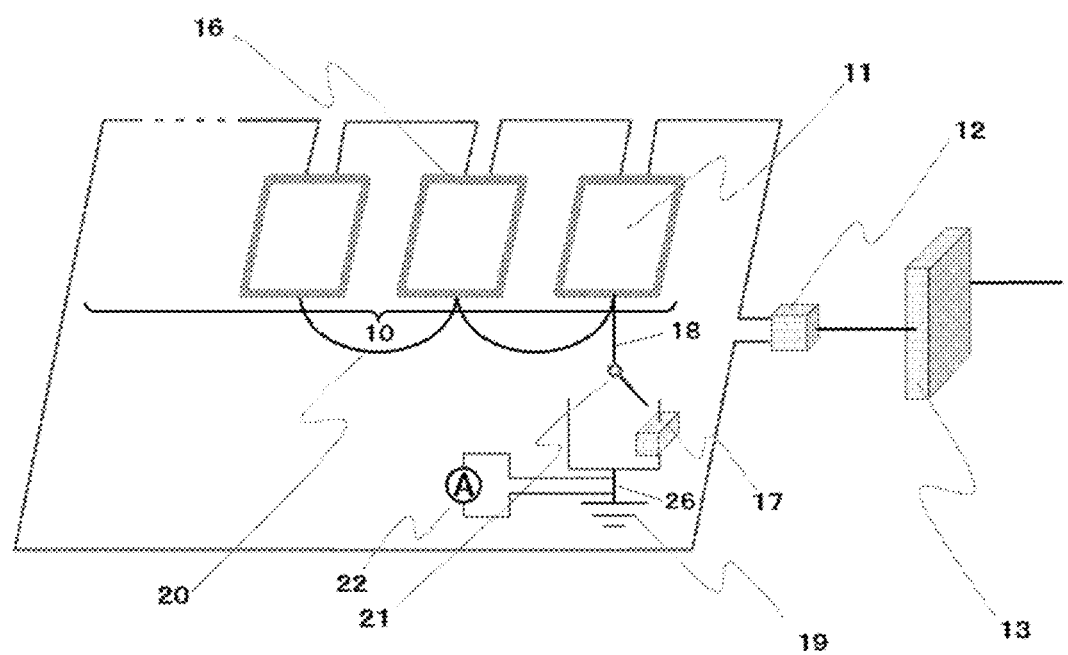
FIG. 5 is a configuration diagram illustrating another example (second aspect) of the embodiment of the photovoltaic generation system of the present invention.

A photovoltaic generation system of 3.38 kW as illustrated in FIG. 5 was prepared. The solar cell module 11 was a typical silicon solar cell module formed with a single-crystal p-type substrate. The solar cell module was sealed with a seal material, and, further, sandwiched between a white tempered plate glass and a back sheet, and laminated. EVA was used as the seal material, and a sheet obtained by sandwiching both sides of PET (PolyEthylene Terephthalate) with tedlar PVF (Poly Vinyl Fluoride) of Dupon was used as the back sheet. This solar cell module was made by connecting 60 solar cells in series (so-called, 60 series), and had maximum output of 260 W, a nominal open circuit voltage was 37.9 V, and a nominal short-circuit current was 9.10 A. In the present example, these 13 solar cell modules were connected in series and disposed at a sunshiny location. The solar cell modules connected in series in this manner were connected to the power conditioner 13 via the junction box 12. As the power conditioner at this time, a power conditioner having rated output of 4.4 kW was used. While, as an angle at which the solar cell module 11 is disposed, an angle obtained by subtracting latitude at a location where the solar cell module 11 is disposed from 90° is ideal, in order to reduce a distance between the solar cell modules 11, the angle is typically made smaller, and, in the present embodiment, the angle was set at 20°.

As the constant voltage power supply 17, a constant voltage power supply which can apply up to 350 V was used, and the negative electrode of the constant voltage power supply 17 was connected to an earth drawing hole of the aluminum frame 16 of the solar cell module 11 disposed at an end of the solar cell array 10 via the switch 21 using a conductive wire cable (the conductive wire 18 in FIG. 5).

Then, the solar cell module disposed at the end of the solar cell array 10 was connected to other solar cell modules by connecting this earth drawing hole with the earth wire 20. At this time, in order to prevent erosion due to contact of different types of metals, the first conductive wire 18 or the earth wire 20 and the aluminum frame 16 were securely fastened with a screw by utilizing a stainless-steel star washer. Meanwhile, the positive electrode side of the constant voltage power supply 17 was connected to the grounding electrode 19 through class C grounding work. In the present example, the switch 21 was set such that, in the case where the ammeter 22 detects a current, a signal was issued from the ammeter and supply of a potential was automatically stopped, the constant voltage power supply 17 was connected for 24 hours, and a potential of −180 V was continuously supplied to the aluminum frame 16.

Comparative Example 1

Figure 8:
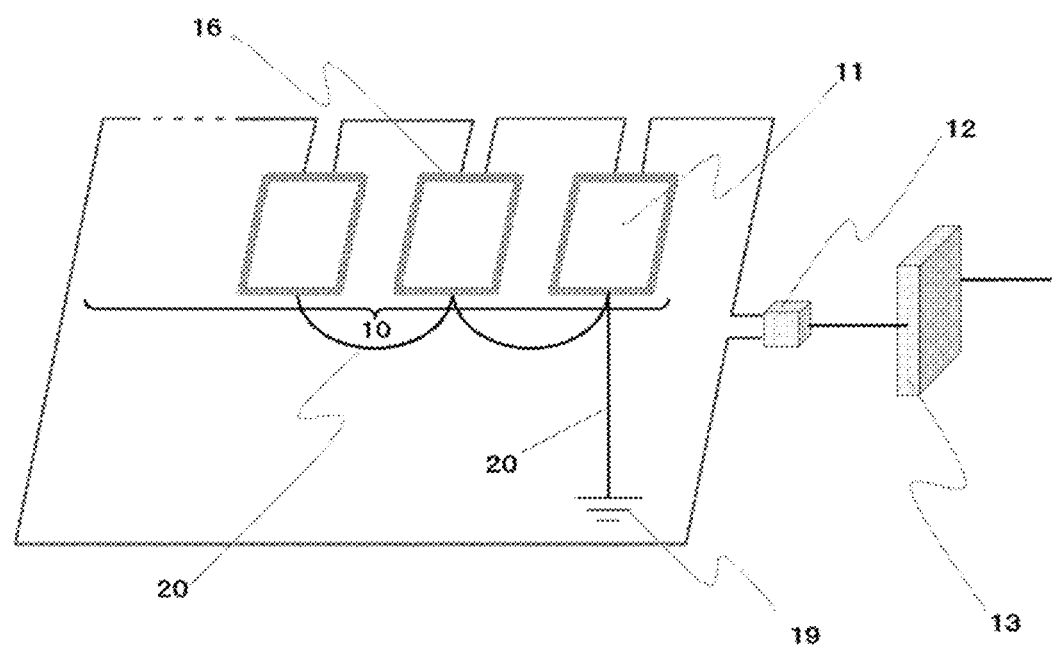
FIG. 8 is a configuration diagram illustrating a photovoltaic generation system of Comparative Examples 1 and 2.

By employing a module configuration of the solar cell array 10 similar to Example 1, a photovoltaic generation system as illustrated in FIG. 8 was constructed. That is, while the photovoltaic generation system was grounded by connecting the earth drawing hole of the aluminum frame 16 of each solar cell module 11 with the earth wire 20 and performing grounding work for grounding (connecting to the grounding electrode 19) the end of the earth wire 20, the constant voltage power supply, the switch, and the ammeter were not provided. Other points were made the same as Example 1.

Example 2

Figure 6:
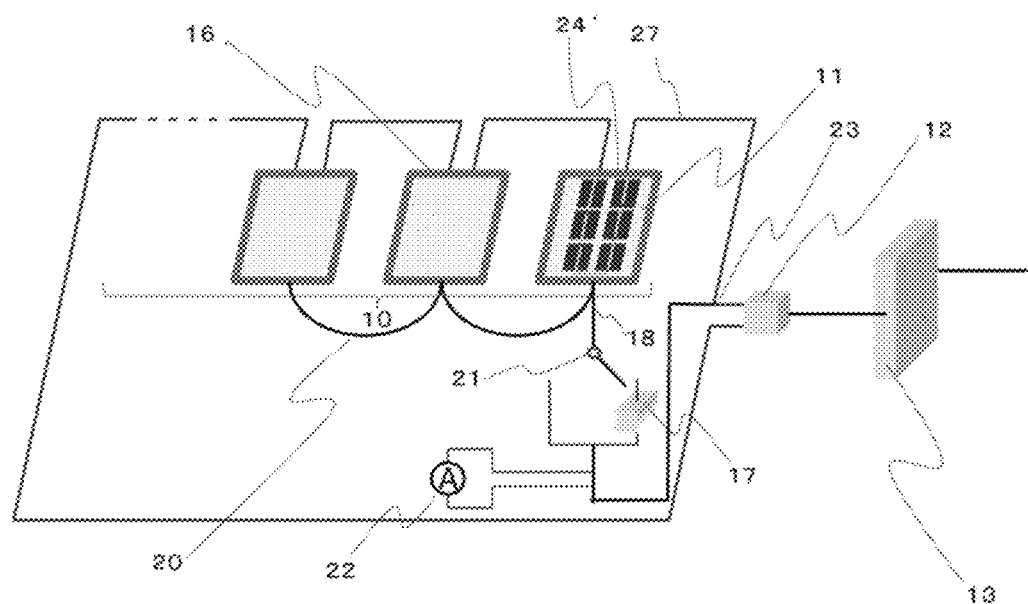
FIG. 6 is a configuration diagram illustrating still another example (third aspect) of the embodiment of the photovoltaic generation system of the present invention.

A photovoltaic generation system of 5.40 kW as illustrated in FIG. 6 was prepared. The solar cell module 11 was a solar cell module in which silicon solar cells formed with single crystal n-type substrates were connected in series. A seal material and a back sheet which were similar to those in Example 1 were used.

This solar cell module was 60 series and had maximum output of 270 W, a nominal open circuit voltage was 38.5 V, and a nominal short-circuit current was 9.35 A. In the present example, these 20 solar cell modules were connected in series and disposed at a sunshiny location. The solar cell modules connected in series in this manner were connected to the power conditioner 13 via the junction box 12. At this time, a power conditioner having rated output of 5.5 kW was used as the power conditioner 13. An angle at which the solar cell module 11 was disposed was set at 20° also in the present example in a similar manner to Example 1.

Figure 7:
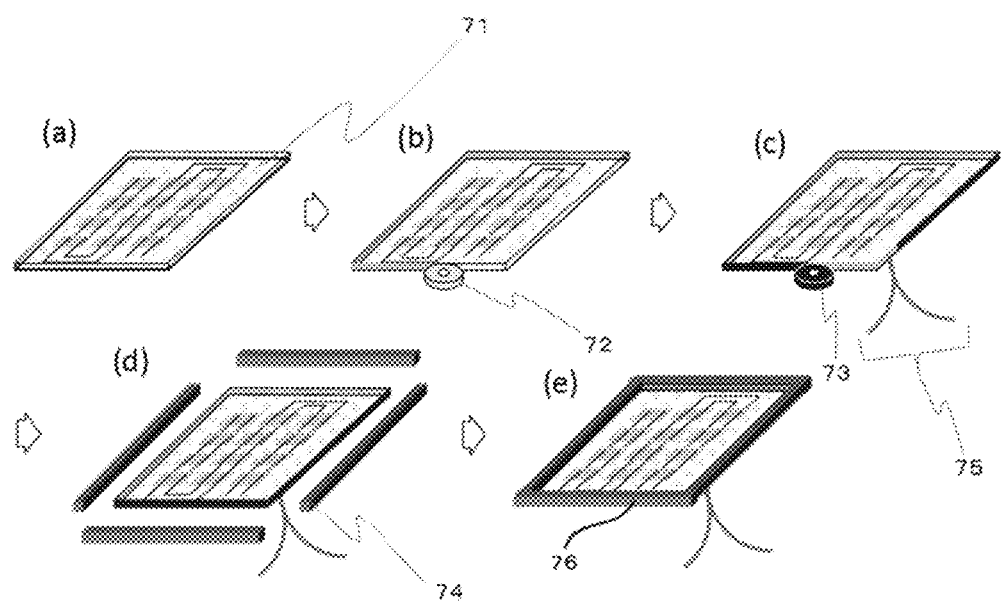
FIG. 7 is a diagram illustrating a mounting method of a metal frame of a solar cell module in yet another example (fourth aspect) of the embodiment of the photovoltaic generation system of the present invention.

In the present example, in order to lower a possibility of an electric shock, as illustrated in FIG. 7, a periphery of the laminate molded body 71 formed with laminated white tempered plate glass/EVA/solar cell/EVA/back sheet was surrounded with the aluminum tape 72 before the aluminum frame was attached, and, further, the periphery was surrounded and insulated using the butyl rubber tape 73 so as to avoid conduction between the aluminum tape 72 and the aluminum frame 76. Then, the aluminum frame parts 74 were assembled. At this time, the coated conductive wire 75 brought into contact with the aluminum tape 72 was extracted from a side of the aluminum frame 76 to the back side of the solar cell module such that a potential could be applied to the aluminum tape 72.

Also in the present example, as the constant voltage power supply 17, a constant voltage power supply which can apply up to 350 V was utilized, and the negative electrode of the constant voltage power supply 17 was connected to one coated conductive wire 75 which was conductive with the aluminum tape 72 of the solar cell module disposed at the end of the solar cell array 10, via the switch 21. Then, the solar cell module was also connected to another solar cell module 11 in the solar cell array 10 by connecting the coated conductive wire 75. Meanwhile, the positive electrode side of the constant voltage power supply 17 was connected to the junction 23 on the lower potential side of the solar cell array circuit as illustrated in FIG. 6.

In the present example, the switch 21 was constantly turned to the constant voltage power supply 17 side, and a potential of −10 V with respect to the junction 23 was supplied to the aluminum tape 72. Also in the present example, a feedback circuit was introduced such that, in the case where the ammeter 22 detected a current, a signal was issued from the ammeter and supply of a potential was immediately stopped.

Comparative Example 2

By employing a module configuration of the solar cell array similar to that in Example 2, a photovoltaic generation system as illustrated in FIG. 8 was constructed. That is, while the photovoltaic generation system was grounded by connecting the aluminum tapes of the respective solar cell module with the earth wire 20 and performing grounding work for grounding the end of the earth wire 20, the constant voltage power supply and the switch were not provided. Other points were made the same as Example 2.

Example 3

A photovoltaic generation system of 5.40 kW having the same system configuration as that of Example 2 was prepared. However, in the present example, in terms of safety concerning an electric shock and electric leakage, the switch 21 was turned to the constant voltage power supply 17 side only during nighttime (while power is not generated), and turned to the junction 23 side during the day (while power was generated) (see FIG. 6). At this time, during nighttime (while power was not generated), a potential of −12 V corresponding to approximately 30% (slightly greater than 30%) of the open circuit voltage of the solar cell module with respect to the junction 23 was supplied to the aluminum tape 72 (see FIG. 7). Other operation methods were made the same as Example 2.

Example 4

A photovoltaic generation system of 5.40 kW having the same system configuration as that in Example 3 was prepared. However, during nighttime (while power was not generated), a potential of −9 V which was less than 30% of the open circuit voltage of the solar cell module with respect to the junction 23 was supplied to the aluminum tape 72 (see FIG. 7). Other operation methods were made the same as Example 3.

In Examples 1 to 4 and Comparative Examples 1 and 2, before the solar cell modules were attached in the photovoltaic generation system, initial solar cell electrical characteristics were measured using a solar simulator for a solar cell module. The electrical characteristics of the solar cell module at the lowest potential side in the solar cell array were measured. A spectrum of irradiated light used for measurement was AM 1.5 Global/Class A, and its intensity was 1 kW/m². As the solar simulator, a solar simulator whose pulse width was a long pulse of 50 milliseconds, and which enabled accurate measurement even in a crystal system solar cell whose minority carrier lifetime was relatively long, was used.

Figure 9:
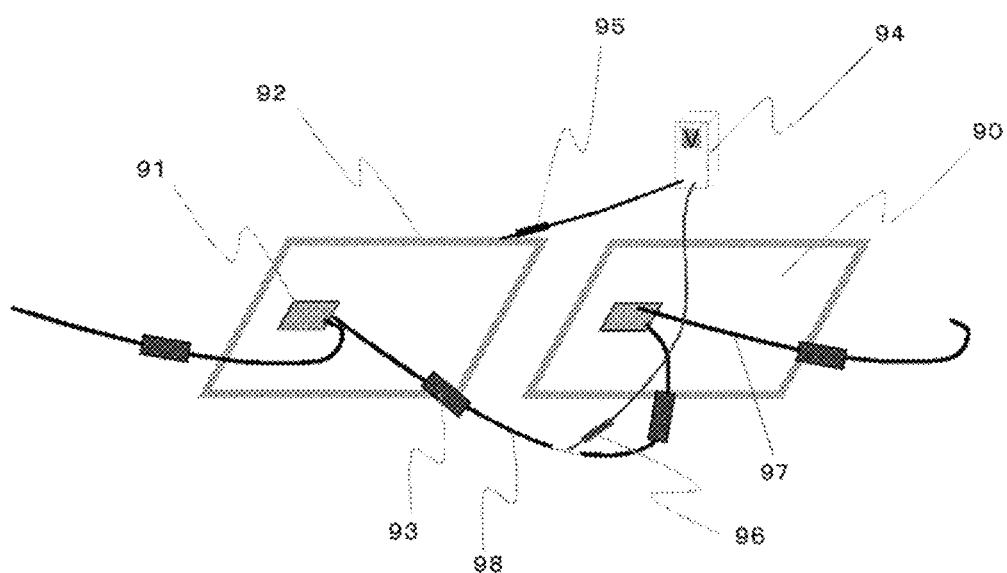
FIG. 9 is a diagram for explaining a method for measuring a potential difference between the conductor parts and the solar cell.

Then, in order to examine a voltage actually applied between the solar cell and the metal frame (or the aluminum tape) within the solar cell module, a potential difference between the metal frame (or the aluminum tape) and the solar cell of each module in the day and during nighttime was measured in a manner illustrated in FIG. 9.

A tester 94 was prepared, and a potential difference was measured by bringing one terminal pin (a + terminal of the tester) 95 into contact with the aluminum frame (or the aluminum tape) 92 and bringing the other terminal pin (a − terminal of the tester) 96 into contact with a cable connecting the solar cell modules in series. Actually, because both the aluminum frame and the cable were coated for preventing an electric shock, and the aluminum tape was covered with an insulating tape, it was necessary to devise ways of measurement. For example, it was only necessary to bring a pin of the tester (a + terminal of the tester 95) into contact with a position of the hole for an earth terminal which is not subjected to alumite treatment. Meanwhile, in order to bring a pin of the tester direct contact with the cable 97 connecting the solar cell modules in series (that is, a conductive wire connecting junction boxes 91 provided on the back side 90 of the solar cell modules), because it was necessary to peel the coating, there occurred a problem. In this case, for example, it was only necessary to prepare an auxiliary cable for test 98 which had male and female connectors that fitted the connector 93 of the cable 97 of the solar cell modules at both ends, and which had a portion around a middle point where coating was intentionally peeled, and connect the auxiliary cable for test 98 to the cable 97 between the solar cell modules and intentionally bring the pin of the tester (a − terminal of the tester 96) into contact with the portion where coating was peeled. By this means, it was possible to measure a potential difference.

Figure 10:
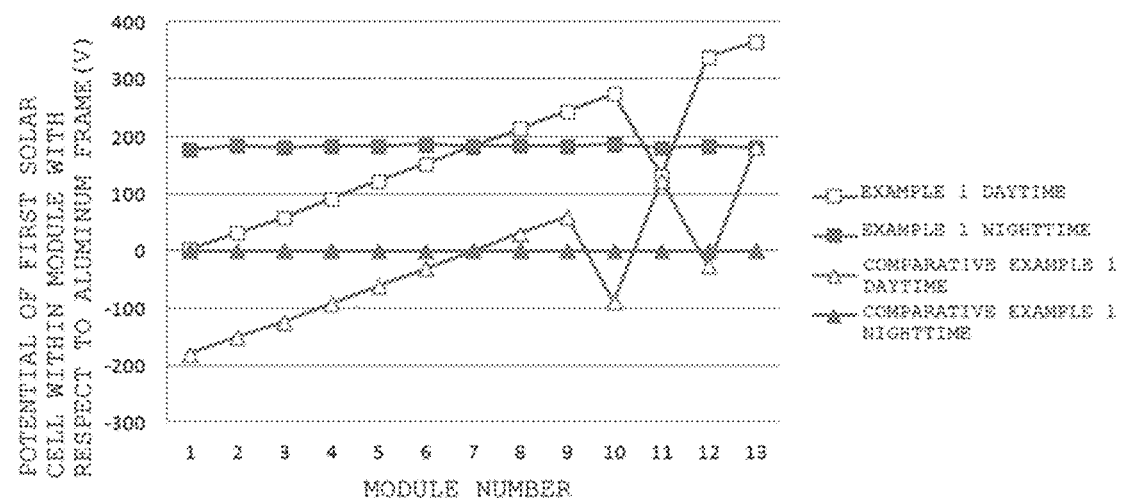
FIG. 10 is a diagram illustrating a potential with respect to an aluminum frame of a solar cell representing each solar cell module within a solar cell array of Example 1 and Comparative Example 1.
Figure 11:
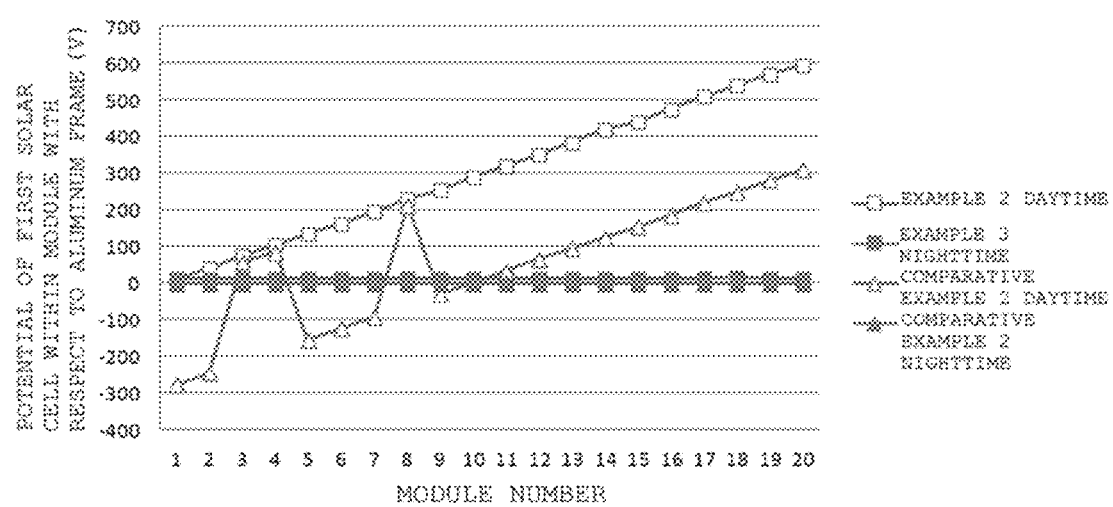
FIG. 11 is a diagram illustrating a potential with respect to an aluminum tape of a solar cell representing each solar cell module within solar cell array of Example 2, Comparative Example 2 and Example 3.

Measurement results of a potential of the solar cell within the solar cell module with respect to the metal frame (or the aluminum tape) examined from the solar cell module on the lower potential side are illustrated in FIG. 10 and FIG. 11. In the present measurement, because a potential difference between a terminal at a lower potential side and the frame (or the aluminum tape) was measured, values indicated in FIG. 10 and FIG. 11 can be regarded as a "potential of the first solar cell within the module with respect to the aluminum frame (or the aluminum tape)" to be exact. FIG. 10 illustrates measurement results of Example 1 and Comparative Example 1, and FIG. 11 illustrate measurement results of Example 2, Comparative Example 2 and Example 3. Here, numbers on the horizontal axis indicate numbers of measured solar cell modules.

In Example 1, because a potential of −180 V was continuously applied to the aluminum frame 16 of the solar cell module 11, a potential of the solar cell 24 within the solar cell module 11 became relatively higher, and the potential became 0 V or more with respect to the aluminum frame 16 even in a cell within the solar cell module at the end where the potential was the lowest in the day (while power was generated). Therefore, at the opposite end of the system, a potential of the solar cell module 11 with respect to the aluminum frame 16 became 360 V or more. By this means, basically, there was no portion where the potential of the solar cell became lower than that of the aluminum frame 16 within the system in Example 1. Because the solar cell did not generate power during nighttime (while power was not generated), increase in a voltage could not be seen for each solar cell module, and potentials of the solar cells with respect to the aluminum frame 16 in all the solar cell modules became higher by a voltage difference of 180 V which was generated by a potential being supplied to the aluminum frame 16.

On the other hand, in Comparative Example 1, a potential of the solar cell within the solar cell module on a lower potential side was basically negative with respect to the aluminum frame 16 in the day, and a potential of the solar cell within the solar cell module on a higher potential side was positive with respect to the aluminum frame 16. That is, potentials of approximately half of the solar cells in the solar cell system were negative with respect to the aluminum frame 16, which creates a condition that sodium ions were attracted to the solar cell side. Note that, as illustrated in FIG. 10, while there were some solar cell modules where potentials did not regularly change by increase in a voltage, such a phenomenon was often observed in measurement. While details are unknown, probably, it can be considered that this phenomenon occurred because the photovoltaic generation system was not completely grounded and was put into a floating state, and a potential was not settled.

In Example 2, as a result of continuing to apply −10 V, in a similar manner to Example 1, a solar cell where a potential became negative with respect to the aluminum tape 72 could not be seen. Further, a case where, sometimes, potentials of some solar cell modules became potentials deviated from expectation was not seen. This is because the negative electrode side of the constant voltage power supply was connected to the solar cell with the lowest potential in the solar cell array. By this means, it can be considered that there was no more solar cell module in a floating state. Note that, while a potential difference with the aluminum tape during nighttime in Example 2 is not illustrated in FIG. 11, potentials around +10 V with respect to the aluminum tape were observed in the solar cells of all solar cell modules.

In Comparative Example 2, tendency of a potential difference with an aluminum tape which is similar to that in Comparative Example 1 is indicated. Because power was not generated during nighttime (while power was not generated), a potential was approximately 0 V with respect to the potential of the aluminum tape. Meanwhile, it can be understood that, in the day (while power was generated), potentials of approximately half of the solar cell modules (solar cell modules on the lower potential side) were negative with respect to the potential of the aluminum tape, and these solar cell modules were under threat of PID.

In Example 3, a potential corresponding to approximately 30% (slightly greater than 30%) of the opening voltages of the solar cell modules was supplied only during nighttime (while power was not generated), and, when the potential was actually measured, a value of approximately 12 V with respect to the potential of the aluminum tape could be obtained at all solar cell modules during nighttime (while power was not generated). Further, in Example 4, as a result of supplying a potential corresponding to less than 30% of the opening voltages of the solar cell modules only during nighttime (while power was not generated), while not illustrated in FIG. 11, when the potential was measured, a potential in a range of 9 V±1 V with respect to the aluminum tape could be obtained at the solar cells within the solar cell modules during nighttime (while power was not generated).

In order to examine change of performance of the solar cell modules, the solar cell modules were removed from mounts 40 days later, and solar cell electric characteristics were examined using the solar simulator for Examples 1 to 4 and Comparative Examples 1 and 2. The solar cell module on the lowest potential side in the solar cell array was measured in a similar manner as described above. The measurement conditions were the same as the above. The measurement result is indicated in Table 1.

Table 1 indicates initial data of the solar cell module directly connected to the negative electrode of the power conditioner and data after the solar cell module has been provided for 40 days. That is, the data in Table 1 indicates characteristics of the solar cell module in which the potential of the solar cell is the lowest in the photovoltaic generation system and sodium ions are most likely to be attracted to the solar cell side. That is, it can be said that Table 1 indicates characteristics of the solar cell module in which PID is most likely to occur. Incidentally, the ammeter 22 indicated zero while the solar cell modules were mounted in all of Examples 1 to 4 and Comparative Examples 1 and 2, and there was no electric leakage, or the like, and the solar cell modules were not replaced.

Figure 12:
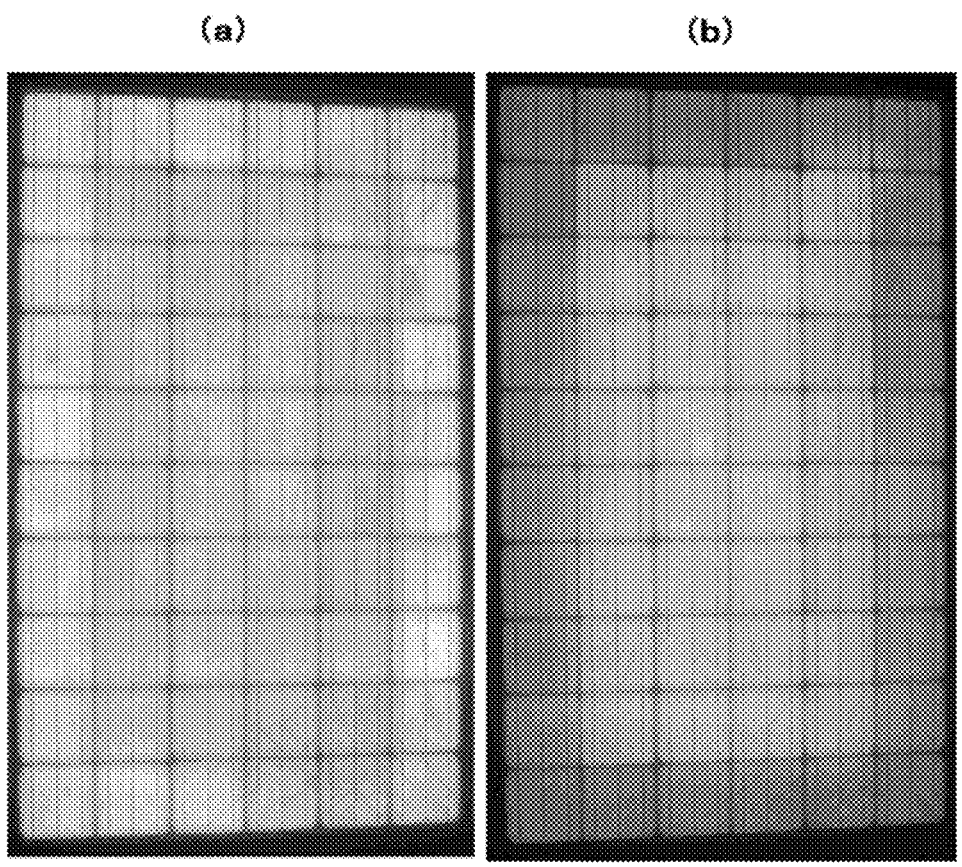
FIG. 12 is a diagram illustrating an EL image of a solar cell module on a lowest potential side within the solar cell array 40 days later, in the photovoltaic generation systems of Example 2 and Comparative Example 2.

Further, concerning the solar cell modules in Example 2 and Comparative Example 2, a current was made to flow in a forward direction with respect to pn junction on the light receiving surface of the solar cell, and an image of EL (Electro Luminescence) (hereinafter, referred to as an EL image) was photographed with a camera. The result is illustrated in FIG. 12. Here, FIG. 12(a) illustrates an EL image of Example 2, and FIG. 12(b) illustrates an EL image of Comparative Example 2.

TABLE 1

| | short-circuit current (A) | | open circuit voltage (V) | | fill factor | | maximum output (W) | |
|---|---|---|---|---|---|---|---|---|
| | initial value | 40 days later | initial value | 40 days later | initial value | 40 days later | initial value | 40 days later |
| Example 1 | 9.08 | 9.05 | 37.7 | 37.7 | 0.762 | 0.763 | 261 | 260 |
| Comparative Example 1 | 9.12 | 8.99 | 37.5 | 37.0 | 0.760 | 0.687 | 260 | 229 |
| Example 2 | 9.39 | 9.37 | 38.8 | 38.8 | 0.755 | 0.757 | 275 | 275 |
| Comparative Example 2 | 9.43 | 8.73 | 38.8 | 36.3 | 0.746 | 0.738 | 273 | 234 |
| Example 3 | 9.42 | 9.39 | 38.8 | 38.7 | 0.749 | 0.752 | 274 | 273 |
| Example 4 | 9.40 | 9.01 | 38.7 | 37.0 | 0.750 | 0.751 | 273 | 250 |

As is clear from Table 1, in the case where a negative potential was supplied to the aluminum frame from outside of the solar cell modules, and the potential of the aluminum frame was intentionally made lower than the potentials of the solar cells, in Example 1, compared to Comparative Example 1, it can be known that the fill factor and the maximum output did not decrease. This is because sodium ions which were cause of PID were not accumulated in the vicinity of the solar cells. Meanwhile, in Comparative Example 2, the short-circuit current and the open circuit voltage decreased may be because a form of degradation was different from that in Comparative Example 1, which resulted in decrease in maximum output. In Example 2, because the potential of the aluminum tape was intentionally made lower than the potentials of the solar cells, no degradation was found. In Example 3 and Example 4 in which a negative voltage was supplied with respect to the junction 23 only during nighttime (while power was not generated), in Example 4 in which an absolute value of the negative potential to be supplied was small, little degradation in solar cell characteristics was found. This is because the absolute value of the negative potential to be supplied was smaller in Example 4 than in Example 3, a degree of restoration from PID occurring in the day (while power was generated) was smaller than that in Example 3. Therefore, in order to suppress PID, it is preferable to supply a negative potential having an absolute value of a voltage corresponding to approximately 30% or more of the open circuit voltages of the solar cell modules.

The above-described results will be clear from the EL image in FIG. 12. As illustrated in FIG. 12, it can be confirmed that in the EL image of the solar cell module on the lowest potential side in Comparative Example 2 in which a negative potential was not supplied from outside, part in the vicinity of the aluminum frame became dark (see FIG. 12(b)) and PID occurred. Meanwhile, a shadow of the EL image could not be seen in Example 2 in which the potential of the aluminum tape was made equal to or lower than the potentials of the solar cells. The solar cell in the vicinity of the aluminum frame would rather look bright, and, further, characteristics seems to be improved (see FIG. 12(a)). It can be understood that supply of a voltage to the aluminum frame (or the aluminum tape) of the modules by the constant voltage power supply in this manner as in the present invention can be measures against PID.

Note that the present invention is not limited to the above-described embodiment. The above-described embodiment is illustrative and has substantially the same configuration as that of the technical idea recited in the claims of the present invention and any of those that achieve similar effects is incorporated into the technical scope of the present invention.

The invention claimed is:

1. A photovoltaic generation system comprising: a solar cell array formed with one or more solar cell modules; and a power conditioner, wherein
    each of the solar cell modules includes one or more solar cells,
    the photovoltaic generation system further comprises a first conductive wire connected to conductor parts which is provided at each of the solar cell modules and which is insulated from the solar cells and a constant voltage power supply whose one end is connected to the first conductive wire, and
    a potential is supplied to the conductor parts by the constant voltage power supply.

2. The photovoltaic generation system according to claim 1,
    wherein the potential supplied to the conductor parts is a negative potential.

3. The photovoltaic generation system according to claim 1,
    wherein each of the solar cell modules includes a plurality of solar cells, and the solar cells are connected to one another with a second conductive wire.

4. The photovoltaic generation system according to claim 2,
    wherein each of the solar cell modules includes a plurality of solar cells, and the solar cells are connected to one another with a second conductive wire.

5. The photovoltaic generation system according to claim 1,
    wherein the other end of the constant voltage power supply is connected to a third conductive wire, and
    the first conductive wire is connected to a grounding electrode via the constant voltage power supply and the third conductive wire.

6. The photovoltaic generation system according to claim 2,
    wherein the other end of the constant voltage power supply is connected to a third conductive wire, and
    the first conductive wire is connected to a grounding electrode via the constant voltage power supply and the third conductive wire.

7. The photovoltaic generation system according to claim 3,
    wherein the other end of the constant voltage power supply is connected to a third conductive wire, and
    the first conductive wire is connected to a grounding electrode via the constant voltage power supply and the third conductive wire.

8. The photovoltaic generation system according to claim 4,
    wherein the other end of the constant voltage power supply is connected to a third conductive wire, and
    the first conductive wire is connected to a grounding electrode via the constant voltage power supply and the third conductive wire.

9. The photovoltaic generation system according to claim 1,
    wherein the solar cell array includes a plurality of solar cells,
    the other end of the constant voltage power supply is connected to a third conductive wire, and
    the first conductive wire is connected to a solar cell with the lowest potential among the plurality of solar cells included in the solar cell array via the constant voltage power supply and the third conductive wire.

10. The photovoltaic generation system according to claim 2,
    wherein the solar cell array includes a plurality of solar cells,
    the other end of the constant voltage power supply is connected to a third conductive wire, and
    the first conductive wire is connected to a solar cell with the lowest potential among the plurality of solar cells included in the solar cell array via the constant voltage power supply and the third conductive wire.

11. The photovoltaic generation system according to claim 3,
    wherein the solar cell array includes a plurality of solar cells,
    the other end of the constant voltage power supply is connected to a third conductive wire, and
    the first conductive wire is connected to a solar cell with the lowest potential among the plurality of solar cells included in the solar cell array via the constant voltage power supply and the third conductive wire.

12. The photovoltaic generation system according to claim 5, wherein an ammeter is connected to one of the first conductive wire, the constant voltage power supply and the third conductive wire.

13. The photovoltaic generation system according to claim 6,
wherein an ammeter is connected to one of the first conductive wire, the constant voltage power supply and the third conductive wire.

14. The photovoltaic generation system according to claim 1,
wherein the conductor parts to which the first conductive wire is connected is a metal frame provided so as to enclose each of the solar cell modules.

15. The photovoltaic generation system according to claim 2,
wherein the conductor parts to which the first conductive wire is connected is a metal frame provided so as to enclose each of the solar cell modules.

16. The photovoltaic generation system according to claim 1,
wherein the conductor parts to which the first conductive wire is connected is a conductive film provided so as to enclose each of the solar cell modules, and
the first conductive wire is insulated from a metal frame provided so as to enclose the conducive film via an insulating film.

17. The photovoltaic generation system according to claim 2,
wherein the conductor parts to which the first conductive wire is connected is a conductive film provided so as to enclose each of the solar cell modules, and
the first conductive wire is insulated from a metal frame provided so as to enclose the conducive film via an insulating film.

18. A method for using the photovoltaic generation system according to claim 1,
wherein the potential is supplied to the conductor parts by the constant voltage power supply.

19. The method for using the photovoltaic generation system according to claim 18,
wherein the potential is supplied to the conductor parts by the constant voltage power supply while power is not generated.

20. The method for using the photovoltaic generation system according to claim 19,
wherein the potential having an absolute value of equal to or greater than 30% of open voltages of the solar cell modules is supplied to the conductor parts by the constant voltage power supply while power is not generated.

* * * * *

UNITED STATES PATENT AND TRADEMARK OFFICE
CERTIFICATE OF CORRECTION

PATENT NO. : 10,686,082 B2
APPLICATION NO. : 15/759715
DATED : June 16, 2020
INVENTOR(S) : Hiroyuki Otsuka It is certified that error appears in the above-identified patent and that said Letters Patent is hereby corrected as shown below:

In the Claims

Column 19, Claim 1, Line 52 insert --a-- before "conductor";

Column 19, Claim 1, Line 52 delete "parts" and insert --part--.

Signed and Sealed this
Eighth Day of September, 2020

Andrei Iancu
*Director of the United States Patent and Trademark Office*